(12) United States Patent
Kao et al.

(10) Patent No.: US 9,905,628 B2
(45) Date of Patent: Feb. 27, 2018

(54) DISPLAY PANEL WITH VARYING CONDUCTIVE PATTERN ZONE

(71) Applicant: Innolux Corporation, Miao-Li County (TW)

(72) Inventors: Chi-Lun Kao, Miao-Li County (TW); Hao-Jung Huang, Miao-Li County (TW); Yi-Hua Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 51 days.

(21) Appl. No.: 15/092,836

(22) Filed: Apr. 7, 2016

(65) Prior Publication Data

US 2016/0218167 A1  Jul. 28, 2016

Related U.S. Application Data

(63) Continuation of application No. 14/530,887, filed on Nov. 3, 2014, now Pat. No. 9,337,442.

(30) Foreign Application Priority Data

Nov. 5, 2013  (TW) .............................. 102140115 A

(51) Int. Cl.
  *H01L 29/08* (2006.01)
  *H01L 35/24* (2006.01)
  *H01L 51/00* (2006.01)
  *H01L 27/32* (2006.01)
  *H01L 51/52* (2006.01)

(52) U.S. Cl.
  CPC ...... *H01L 27/3276* (2013.01); *H01L 27/3251* (2013.01); *H01L 51/5246* (2013.01)

(58) Field of Classification Search
  CPC ............. H01L 27/3276; H01L 51/5246; H01L 27/3251; H01L 27/32; H01L 51/52
  See application file for complete search history.

(56) References Cited

U.S. PATENT DOCUMENTS

| | | | |
|---|---|---|---|
| 7,371,143 B2 | 5/2008 | Becken et al. | |
| 2005/0052606 A1* | 3/2005 | Lee | G02F 1/133512 349/153 |
| 2005/0140306 A1 | 6/2005 | Park | |
| 2005/0174048 A1 | 8/2005 | Matsukaze | |
| 2007/0001591 A1* | 1/2007 | Tanaka | H01L 51/5259 313/504 |
| 2012/0049723 A1 | 3/2012 | Lee | |
| 2014/0041924 A1* | 2/2014 | Cok | G06F 3/044 174/268 |
| 2014/0078077 A1* | 3/2014 | Choi | H01L 27/323 345/173 |

* cited by examiner

*Primary Examiner* — Charles Garber
*Assistant Examiner* — Abdulfattah Mustapha
(74) *Attorney, Agent, or Firm* — McClure, Qualey & Rodack, LLP

(57) ABSTRACT

An organic electroluminescence display panel includes a substrate, an organic light-emitting layer disposed on the substrate, a first conductive pattern with a plurality of first meshes disposed on the substrate, a second conductive pattern with a plurality of second meshes disposed on the substrate and separated from the first conductive pattern, and a sealant dispensing area overlapped with the first conductive pattern and the second conductive pattern. A distance between two adjacent meshes of the first meshes is different from a distance between two adjacent meshes of the second meshes.

20 Claims, 4 Drawing Sheets

DISPLAY PANEL WITH VARYING CONDUCTIVE PATTERN ZONE

This is a continuation of application Ser. No. 14/530,887, filed Nov. 3, 2014 (now U.S. Pat. No. 9,337,442) and entitled "DISPLAY PANEL WITH VARYING CONDUCTIVE PATTERN ZONE", which claims the benefit of Taiwan patent application serial number 102140115, filed Nov. 5, 2013, the contents of which are incorporated herein by reference.

BACKGROUND

Field of the Invention

The disclosure relates in general to a display panel, and more particularly to a display panel with varying conductive pattern zone.

Description of the Related Art

Today, electronic products with displays panels, such as smart phones, tablet personal computers (i.e. tablet PC, flat PC, ex: iPad), laptops, monitors, and televisions, have become indispensable necessities for working-processing-learning or personal leisure entertaining in the daily life of the modern human beings. Penetration of water vapor/oxygen into the displays panels has considerable effect on the operation lifetime of the electronic device. It is known that the organic light emitting diode display (OLED) has the most severe requirement on the water vapor/oxygen blocking rate.

Since the organic materials and metal cathode of the OLED are highly sensitive to water vapor and oxygen, the device will be deteriorated soon after penetration of water vapor and oxygen. It has been proposed by the researches that the required water vapor transmission rate (WVTR) of a commercial OLED is typically not over $1 \times 10^{-6}$ g/m$^2$/day, and the oxygen transmission rate (OTR) is typically not over $10^{-5}$ to $10^{-3}$ cm$^3$/m$^2$/day for reaching 10000 hours of the operational lifetime. To maintain or even improve the electrical performances of the device and also the operation lifetime and reliability of the display panel, it is necessary to perform the packaging well, such as good adhesion between the opposite substrates of the display panel.

In the assembly of the display panel, the upper and lower substrates are adhered to each other by the sealant. For example, a sealant dispensing area of a TFT display panel extends across the metal regions (comprising the power line, data lines, signal lines, . . . ) on the TFT substrate. Practically, the sealant can be melted at a high temperature; for example, the sealant is typically irradiated and melted by the laser (WVTR of a well-hermetical OLED is typically not over $1 \times 10^{-6}$ g/m$^2$/day), and the laser beam travels along the metal traces and metal blocks. Some of the laser energy is absorbed and/or reflected by the metal portions which creates an uneven temperature distribution in the frit (metal having high reflectivity and good thermal conductivity) during the sealing process. Therefore, different properties between the metal regions and non-metal regions lead to considerable differences of thermal conductivities which may cause the problems of crack on the sealant and insufficient connection between the substrates. Those problems are also easy to occur at the regions near the boundaries between the metal regions and non-metal regions due to high differences of temperatures in the sealing process. The faulty packaging and assembling of the display panel will lead to the decreases of the yield and reliability of production of the display panel.

SUMMARY

The disclosure is directed to a display panel, such as an organic electroluminescence display panel, with a varying pattern zone. In the embodiment, the display panel comprises conductive patterns at the metal region and non-metal region, and the conductive patterns are corresponding to the sealant dispensing area. The conductive patterns at the metal region (ex: the conductive portions) and the non-metal region (ex: the supplemental conductive portions) can be designed by varying the arrangement such as distribution densities and covering areas, so as to minimize the differences in thermal conductivities between the metal region and the non-metal region, thereby improving the adhesion of the sealant, raising the yield of packaging, increasing reliability and prolonging the useful life of the display panel.

According to one embodiment of the disclosure, an organic electroluminescence display panel is provided, comprising a first substrate, a second substrate assembled to the first substrate, an organic light-emitting layer positioned between the first and second substrates, a sealant positioned between and adjacent to the edges of the first and second substrates, a varying pattern zone, and supplemental pattern zone. The second substrate comprises a sealant dispensing area, a metal region, and a non-metal region adjacent to the metal region. The metal region includes a plurality of traces. The sealant is formed in the sealant dispensing area of the second substrate. The varying pattern zone is formed at one of the traces of the metal region, and is corresponding to the sealant dispensing area. The varying pattern zone comprises plural conductive portions. The supplemental pattern zone is formed at the non-metal region and comprises plural supplemental conductive portions apart from each other. In one embodiment, a width of the conductive portions in the metal region is larger than a width of the supplemental conductive portions in the non-metal region.

According to one embodiment of the disclosure, another organic electroluminescence display panel is provided, comprising the first substrate, the second substrate assembled to the first substrate, the organic light-emitting layer and the sealant as described above. The display panel further comprises a varying pattern zone and a supplemental pattern zone. The varying pattern zone is formed at one of the traces of the metal region and corresponding to the sealant dispensing area, and the varying pattern zone comprises a conductive net with a plurality of meshes. In one example, an arrangement of the meshes is from dense to loose along the direction from the metal region toward the non-metal region. The supplemental pattern zone is formed at the non-metal region and comprises a supplemental conductive net with a plurality of supplemental meshes. In one example, a distance between the meshes in the metal region is larger than a distance between the supplemental meshes in the non-metal region.

The above and other aspects of the disclosure will become better understood with regard to the following detailed description of the preferred but non-limiting embodiments. The following description is made with reference to the accompanying drawings.

DETAILED DESCRIPTION

Figure 1:
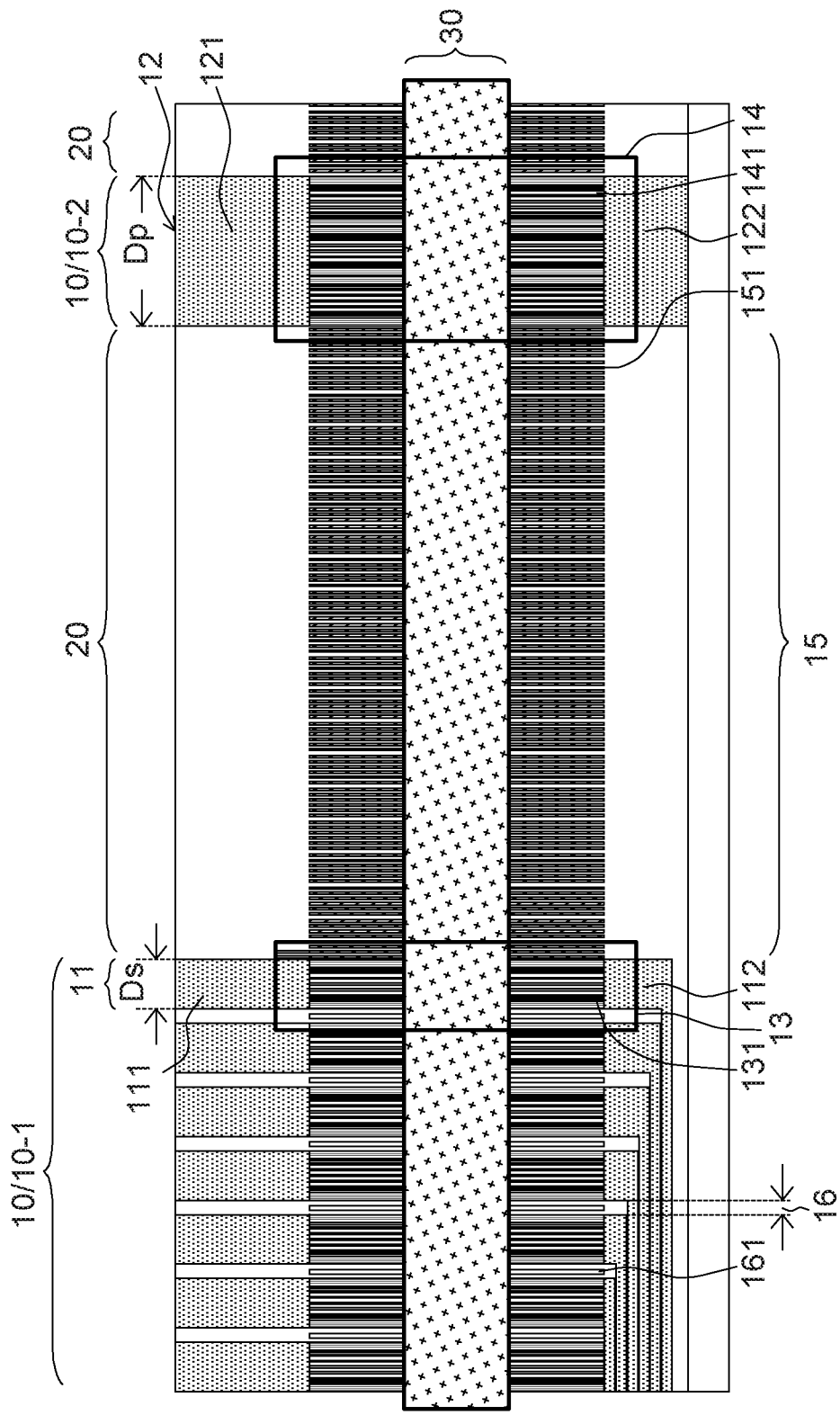
FIG. 1 illustrates a portion of a display panel according to the first embodiment of the present disclosure.

In the embodiment of the present disclosure, a configuration of a display panel at least comprising a varying pattern zone formed at the metal region of a trace and corresponding to the sealant dispensing area is provided. The display panel of the embodiment optionally further comprises a supplemental pattern zone formed at the non-metal region. According to the embodiment, the conductive pattern of the varying pattern zone can be designed by varying the arrangement such as changing the widths, the pitches, the covering areas, the distribution density, ratios of the covering areas, . . . and etc., or by setting the differences of the widths, the pitches, the covering areas, the distribution density, ratios of the covering areas between the supplemental conductive portion at the non-metal region and the conductive portion at the metal region, in order to adjust the way of distribution of the traces. When the sealant is melted for sealing the first substrate and the second substrate (such as by the laser energy) of the display panel of the embodiment, the configuration of the varying pattern zones and the supplemental pattern zone of the display panel of the embodiment can minimize the differences in thermal conductivities between the metal region and the non-metal region, thereby preventing the defects of the sealant (such as cracking or peeling off) caused by the differences in thermal conductivities and also decreasing the possibility of cracks in the frit. Accordingly, the adhesion of the sealant of the display panel applied by the design of the embodiment can be increased, thereby raising the yield of packaging, improving the electrical performance of the units and prolonging the useful life of the display panel.

Applications of the disclosure include an organic electroluminescence display (OLED) and other display panels. In the embodiments, the varying pattern zone in the metal region may comprise the stripes of conductive portions, or a conductive net, or other conductive pattern which is able to vary the covering area and/or the distribution density of the corresponding trace at the sealant dispensing area. Also, the supplemental pattern zone formed at the non-metal region may comprise the stripes of supplemental conductive portions, or a supplemental conductive net, or other supplemental conductive pattern which is related to the varying pattern zone and able to buffer the differences of thermal conductivities between the metal region and non-metal region. The embodiments are described in details with reference to the accompanying drawings. The details of the structures of the embodiments are provided for exemplification, and the described details of the embodiments are not intended to limit the present disclosure. The identical and/or similar elements of the embodiments are designated with the same and/or similar reference numerals. It is noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompany drawings are simplified for clear illustrations of the embodiment. The sizes and proportions in the drawings are not directly proportional to actual products, and shall not be construed as limitations to the present disclosure. Thus, the specification and the drawings are to be regard as an illustrative sense rather than a restrictive sense.

First Embodiment

FIG. 1 illustrates a portion of a display panel according to the first embodiment of the present disclosure. A display panel comprises a first substrate, a second substrate disposed correspondingly to the first substrate, and a sealant positioned dispensed near the edges of the first substrate and the second substrate for gluing the first substrate and the second substrate. When the embodiment is applied to an OLED, the display panel further comprises an organic light-emitting layer positioned between the first substrate and the second substrate. The first substrate and the second substrate can be a CF substrate and a TFT substrate, respectively. In the embodiments described below, a TFT substrate is exemplified as the second substrate for illustration, but not for limitation. The first substrate and the second substrate can be a TFT substrate and a CF substrate, respectively. Also, the first substrate and the second substrate can be a TFT substrate and a frit plate. The disclosure has not particular limitation thereto.

As shown in FIG. 1, the second substrate comprises a metal region 10 (including regions 10-1 and 10-2), a non-metal region 20 adjacent to the metal region 10, and a sealant dispensing area 30. The sealant is dispensed at the sealant dispensing area 30. In one embodiment, the metal region 10 comprises a plurality of traces, such as plural signal lines 11 in the regions 10-1 and power lines 12 in the regions 10-2.

In the embodiment, the display panel also comprises a varying pattern zone formed at one of the traces of the metal region 10, such as the varying pattern zone 13 corresponding to a signal line 11 or the varying pattern zone 14 corresponding to a power line 12. Positions of the varying pattern zones 13 and 14 are corresponding to the sealant dispensing area 30, and the varying pattern zones 13 (/14) comprises a plurality of conductive portions 131 (/141). In one embodiment, the display panel further comprises a supplemental pattern zone 15 formed at the non-metal region 20, and the supplemental pattern zone 15 comprises a plurality of supplemental conductive portions 151 apart from each other. Also, position of the supplemental pattern zone 15 is corresponding to the sealant dispensing area 30.

In the first embodiment, a width of the conductive portions 131/141 in the metal region 10 is larger than a width of the supplemental conductive portions 151 in the non-metal region 20. In one embodiment, a distance between the adjacent conductive portions 131/141 in the metal region 10 is larger than a distance between the adjacent supplemental conductive portions 151 in the non-metal region 20. In one embodiment, a covering area of the conductive portions 131/141 in the metal region 10 is larger than a covering area of the supplemental conductive portions 151 in the non-metal region 20.

In one embodiment, an arrangement of the conductive portions 131/141 in the metal region 10 is varied from loose to dense along the direction from a center of the metal region 10 toward the non-metal region 20. In one embodiment, the covering areas of the conductive portions 131/141 in the metal region 10 is varied from large to small along the direction from a center of the metal region 10 toward the non-metal region 20. As shown in FIG. 1, the closer the conductive portions 131/141 of the varying pattern zone 13/14 to the non-metal region 20, the denser the arrangement of those conductive portions 131/141. The farther the conductive portions 131/141 of the varying pattern zone 13/14 from the non-metal region 20, the looser the arrangement of those conductive portions 131/141. Also, in one embodiment, the closer the conductive portions 131/141 to the non-metal region 20, the narrower the conductive portions 131/141 in width; the farther the conductive portions 131/141 from the non-metal region 20, the wider the conductive portions 131/141. However, the ways for configuring and arranging the conductive portions 131/141 of the disclosure are not limited to the details described above.

As shown in FIG. 1, the varying pattern zone 13 (or 14) at the metal region 10 is positioned between two portions of the corresponding trace, and arranged correspondingly at the sealant dispensing area 30. Take a signal line 11 as an example. The signal line 11 comprises a first portion 111, a varying pattern zone 13 and a second portion 112. The varying pattern zone 13 is positioned between the first portion 111 and the second portion 112, and two ends of the conductive portions 131 of the varying pattern zone 13 connect the first portion 111 and the second portion 112. Also, the conductive portions 131 are substantially arranged in parallel and spaced apart from each other. In one embodiment, the first portion 111 and the second portion 112 are configured as the solid metal blocks having the same width Ds of the trace. The conductive portions 131 are spaced apart from each other along the direction of the width Ds of the trace.

In the first embodiment, the varying pattern zone 13 (or 14) at the metal region 10 comprises a plurality of lines as the conductive portions, such as straight lines, or zigzag lines, or other shaped lines. The conductive portions at the metal region 10 can be parallel to or slanted to an extending direction of the integrated portion of the trace, such as an extending direction of the first portion 111 and the second portion 112.

Configurations of the conductive portions of a varying pattern zone corresponding to one trace are described in details as below, with reference to the accompanying drawings.

Figure 2A:
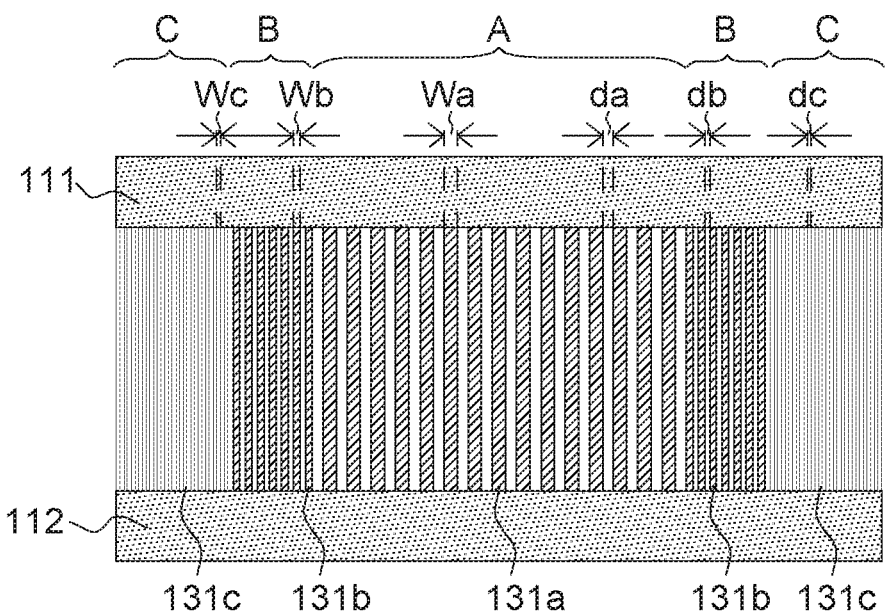
FIG. 2A illustrates a varying pattern zone at the metal region comprising the conductive portions in a striped pattern according to the first embodiment of the present disclosure.

FIG. 2A illustrates a varying pattern zone at the metal region comprising the conductive portions in a striped pattern according to the first embodiment of the present disclosure. Please also refer to FIG. 1. In one embodiment, a varying pattern zone corresponding to one trace comprises a plurality of the conductive portions, such as the first conductive portions 131a at the region A, the second conductive portions 131b at the region B and the third conductive portions 131c at the region C.

An arrangement of the conductive portions of the varying pattern zone can be varied, but not limitedly, from loose to dense. As shown in FIG. 2A, the closer the conductive portions to the non-metal region 20, the denser the arrangement of those conductive portions; the farther the conductive portions from the non-metal region 20, the looser the arrangement of those conductive portions. For example, the arrangement of the third conductive portions 131c is denser than that of the second conductive portions 131b, and the arrangement of the first conductive portions 131a is looser than that of the second conductive portions 131b.

In one embodiment, the closer the conductive portions of the varying pattern zone to a central line of the trace (such as the signal line 11), the looser the arrangement of those conductive portions. The closer the conductive portions of the varying pattern zone to two sides of the trace (such as the signal line 11), the denser the arrangement of the conductive portions, as shown in FIG. 1 and FIG. 2A.

The number of the conductive portions per unit area at the metal region 10 can be varied optionally, depending on the requirement of the practical application. In one embodiment, the farther the conductive portions away from the non-metal region 20, the less the number of the conductive portions per unit area; and the closer the conductive portions to the non-metal region 20, the larger the number of the conductive portions per unit area, as shown in FIG. 2A. For example, if the regions A to C have identical area, the region A may include four of the first conductive portions 131a, the region B may include seven or eight of the second conductive portions 131b, and the region C may include ten or twenty (or more) of the third conductive portions 131c. It is noted that the actual number of the conductive portions can be changed and determined, depending on the different widths and spaces of the practical applications. The disclosure is not limited to the ways of distribution described above for exemplification.

Configuration of an embodiment illustrates, but not limitedly, that the closer the conductive portions at the metal region 10 to the non-metal region 20, the narrower the conductive portions in width. The farther the conductive portions from the non-metal region 20, the wider the conductive portions. As depicted in FIG. 2A, the width Wc of the third conductive portion 131c is smaller than the width Wb of the second conductive portion 131b, and the width Wa of the first conductive portion 131a is larger than the width Wb of the second conductive portion 131b. In one embodiment, the conductive portions at the metal region 10, such as the first, second and third conductive portions 131a, 131b and 131c, are wider than the supplemental conductive portions at the non-metal region 20.

Configuration of an embodiment illustrates, but not limitedly, that the farther the conductive portions from the non-metal region 20, the larger the distance between the adjacent conductive portions in the metal region 10. The closer the conductive portions to the non-metal region 20, the smaller the distance between the adjacent conductive portions at the metal region 10. As depicted in FIG. 2A, the distance dc between the third conductive portions 131c is smaller than the distance db of the second conductive portions 131b, and the distance da between the first conductive portions 131a is larger than the distance db of the second conductive portions 131b. Also, in one embodiment, the distance between the adjacent conductive portions (such as the first, second and third conductive portions 131a, 131b and 131c) at the metal region 10 is larger than a distance between the adjacent supplemental conductive portions 151 at the non-metal region 20. Also, in one embodiment, a covering area of the conductive portions (such as the first, second and third conductive portions 131a, 131b and 131c)

at the metal region 10 is larger than a covering area of the supplemental conductive portions 151 at the non-metal region 20.

Although the design of the conductive portions at the metal region 10 of FIG. 2A shows three different patterns (i.e. patterns in the regions A, B and C), the ways for configuring and arranging the conductive portions 131/141 of the disclosure are not limited thereto. In practical applications, configuration of the conductive portions at the metal region may comprise two, three, four, . . . or n of different patterns (n is a positive integer, and n≥2). Also, each area of regions A, B and C or the occupied area ratios there between can be adjusted and modified depending on the actual conditions of practical application, and the disclosure is not limited to the details as described in FIG. 2A.

Figure 2B:
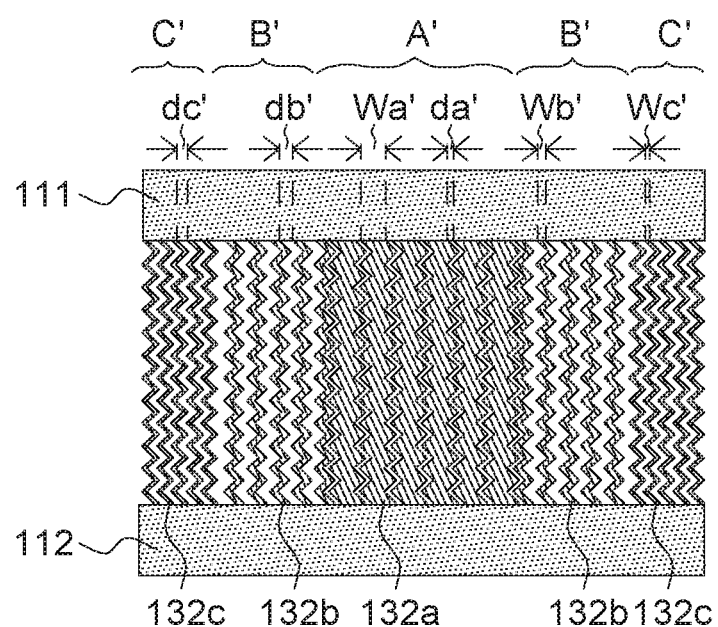
FIG. 2B illustrates a varying pattern zone at the metal region comprising the conductive portions in a zigzag pattern according to the first embodiment of the present disclosure.

FIG. 2B illustrates a varying pattern zone at the metal region comprising the conductive portions in a zigzag pattern according to the first embodiment of the present disclosure. Configuration of the conductive portions in a zigzag pattern as shown in FIG. 2B is similar to that in a striped pattern as shown in FIG. 2A. In FIG. 2B, a varying pattern zone at the metal region 10 corresponding to one trace comprises a plurality of zigzag conductive portions, such as the first zigzag conductive portions 132a at the region A', the second zigzag conductive portions 132b at the region B' and the third zigzag conductive portions 132c at the region C'.

An arrangement of the zigzag conductive portions of the varying pattern zone at the metal region 10 can be varied, but not limitedly, from loose to dense. As shown in FIG. 2B, the closer the zigzag conductive portions to the non-metal region 20, the denser the arrangement of those zigzag conductive portions; the farther the zigzag conductive portions from the non-metal region 20, the looser the arrangement of those zigzag conductive portions. For example, the arrangement of the third zigzag conductive portions 132c is denser than that of the second zigzag conductive portions 132b, and the arrangement of the first zigzag conductive portions 132a is looser than that of the second zigzag conductive portions 132b.

The number of the zigzag conductive portions per unit area ar the metal region 10 can be varied optionally, depending on the requirement of the practical application. In one embodiment, the farther the zigzag conductive portions away from the non-metal region 20, the less the number of the zigzag conductive portions per unit area; and the closer the zigzag conductive portions to the non-metal region 20, the larger the number of the zigzag conductive portions per unit area, as shown in FIG. 2B. For example, if the regions A to C have identical area, the region A' may include two of the first zigzag conductive portions 132a, the region B' may include three or four of the second zigzag conductive portions 132b, and the region C' may include five or more of the third zigzag conductive portions 132c. It is noted that the actual number of the zigzag conductive portions can be changed and determined, depending on the different widths and spaces of the practical applications. The disclosure is not limited to the ways of distribution as exemplified in FIG. 2B or the numbers mentioned above.

As shown in FIG. 2B, configuration of an embodiment illustrates, but not limitedly, that the closer the zigzag conductive portions at the metal region 10 to the non-metal region 20, the narrower the zigzag conductive portions in width. The farther the zigzag conductive portions from the non-metal region 20, the wider the zigzag conductive portions. According to FIG. 2B, the width Wc' of the third zigzag conductive portion 132c is smaller than the width Wb' of the second zigzag conductive portion 132b, and the width Wa' of the first zigzag conductive portion 132a is larger than the width Wb' of the second zigzag conductive portion 132b. Also, in one embodiment, the zigzag conductive portions at the metal region 10, such as the first, second and third zigzag conductive portions 132a, 132b and 132c, are wider than the supplemental zigzag conductive portions at the non-metal region 20. Moreover, in one embodiment, a covering area of the zigzag conductive portions (such as the first, second and third zigzag conductive portions 132a, 132b and 132c) at the metal region 10 is larger than a covering area of the supplemental zigzag conductive portions 151 at the non-metal region 20.

Additionally, it is noted that the distances between the adjacent conductive portions at the metal region 10 can be varied in an order or varied randomly. Different from the design of FIG. 2A (i.e. the farther the conductive portions from the non-metal region 20, the larger the distance between the adjacent conductive portions; the closer, the smaller), the distance da' between the first zigzag conductive portions 132a is the smallest among the distances da', db' and dc', and the distance dc' between the third zigzag conductive portions 132c is smaller than the distance db' of the second zigzag conductive portions 132b, as shown in FIG. 2B. Moreover, the design of the conductive portions, such as the numbers and widths of the conductive portions and the distances between adjacent conductive portions at there own regions, can be adjusted and modified according to the actual requirements (ex: considering the impedance matching between the conductive portions of the varying pattern zone and remained portions of the trace) of practical applications.

Figure 2C:
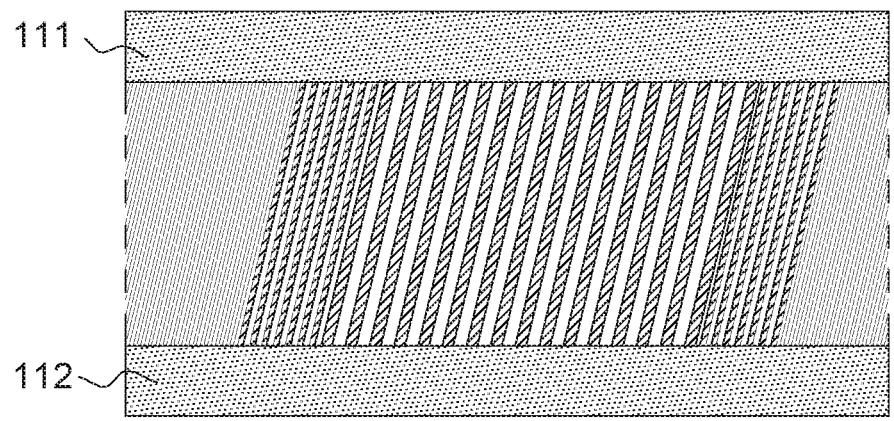
FIG. 2C illustrates a varying pattern zone at the metal region comprising plural conductive portions in a slanted striped pattern according to the first embodiment of the present disclosure.

FIG. 2C illustrates a varying pattern zone at the metal region comprising plural conductive portions in a slanted striped pattern according to the first embodiment of the present disclosure. Arrangement of the conductive portions in the slanted striped pattern of FIG. 2C is similar to that in the striped pattern of FIG. 2B, except for the conductive portions of FIG. 2C being slanted to an extending direction of the first portion and the second portion of the corresponding trace. Please refer to the descriptions above for the arrangement of FIG. 2C, and the details are not redundantly repeated herein.

As depicted in FIG. 2A to FIG. 2C, the designs of the varying pattern zones show, but not limitedly, that the closer the conductive portions to the central line of the corresponding trace, the wider the conductive portions; and the closer the conductive portions to the edges of the corresponding trace, the narrow the conductive portions. As shown in FIG. 2A, the widths Wa of all of the first conductive portions 131a are larger than the widths Wc of the third conductive portions 131c, thereby decreasing the resistance of the central portion of the varying pattern zones and increasing the resistance of the edges of the varying pattern zones. The differences of thermal conductivities between positions of the varying pattern zones can be buffered optionally by adjusting and changing the numbers, the widths of the conductive portions and the distances between adjacent conductive portions in there own regions.

Besides the patterns of the conductive portions in FIG. 2A to FIG. 2C, other configurations of the conductive portions, with different distributions and variations of widths and pitches, are also applicable. Also, the disclosure has no particular limitations to the shape of the conductive portions. It is known that the effect of buffering the differences of thermal conductivities between the metal region and non-metal region can be achieved by modified the designs provided by the embodiments of the disclosure, to meet the requirements of the practical application.

Besides the varying pattern zones 13/14 at the metal region 10, the display panel further comprises a supplemental pattern zone 15 at the non-metal region 20. Some of the design patterns of the supplemental pattern zones are provided and described below.

Figure 3:
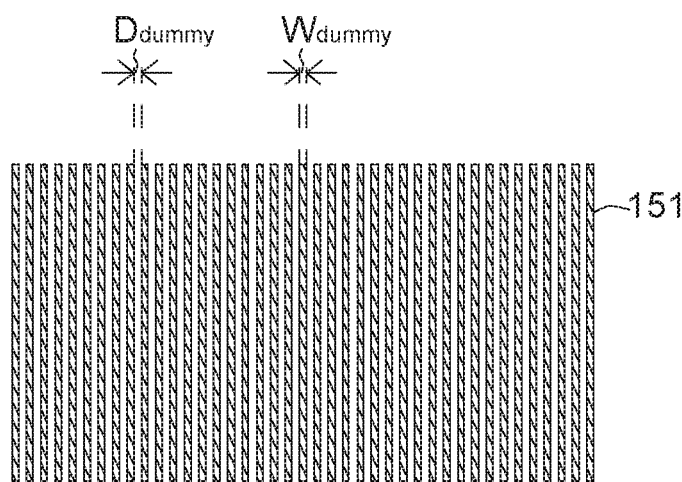
FIG. 3 illustrates a supplemental pattern zone at the non-metal region comprising plural supplemental conductive portions according to an embodiment of the present disclosure.

Please refer to FIG. 1 and FIG. 3. FIG. 3 illustrates a supplemental pattern zone at the non-metal region comprising plural supplemental conductive portions according to an embodiment of the present disclosure. As shown in FIG. 1, the supplemental pattern zone 15 at the non-metal region is disposed between the varying pattern zone 13 of the signal line 11 and the varying pattern zone 14 of the power line, and position of the supplemental pattern zone 15 is corresponding to the sealant dispensing area 30. In one embodiment, the supplemental pattern zone 15 is contiguous to at least a varying pattern zone (ex: two varying pattern zones 13 and 14 in FIG. 1). However, the disclosure is not limited to the configuration of FIG. 1. In other embodiment, the supplemental pattern zone 15 can be formed at a part of the area between the varying pattern zones 13 and 14. In one embodiment, the supplemental pattern zone 15 comprises a plurality of conductive dummy portions 151 spaced apart from each other. As shown in FIG. 3, all of the supplemental conductive portions 151 substantially have the same width, $W_{dummy}$, and are spaced apart from each other substantially by the same pitch, $d_{dummy}$. In one embodiment, a width of the conductive portion of the varying pattern zone 13/14 adjacent to the supplemental pattern zone 15 is substantially equal to a width $W_{dummy}$ of the supplemental conductive portions 151. For example, the width We of the third conductive portion 131c in FIG. 2A is substantially equal to a width $W_{dummy}$ of the supplemental conductive portions 151.

When the sealant is melted for sealing the first substrate and the second substrate (such as by the laser energy), the configuration of the varying pattern zone 13/14 and the supplemental pattern zone 15 can minimize the differences in thermal conductivities between the metal region 10 and the non-metal region 20 (particularly the boundaries between the metal region 10 and the non-metal region 20), thereby preventing the defects of the sealant (such as cracking or peeling off) caused by the differences in thermal conductivities and also decreasing the possibility of cracks in the frit. Accordingly, the adhesion of the sealant of the display panel applied by the design of the embodiment can be increased, thereby improving the yield of packaging.

In one embodiment, the display panel further comprises another supplemental pattern zone 16 disposed between two adjacent varying pattern zones. Please refer to FIG. 1, a supplemental pattern zone 16 is further formed between two adjacent varying pattern zones 13 of the adjacent signal lines 11. Positions of the supplemental pattern zones 16 are corresponding to the sealant dispensing area 30, and each of the supplemental pattern zones 16 comprises at least one conductive part 161. When the sealant-melting spot from the energy source (such as laser source) travels along the traces (such as the signal lines), the differences in thermal conductivities between two adjacent varying pattern zones 13 can be buffered by the supplemental pattern zones 16. The larger the space between the traces (i.e. space between the adjacent varying pattern zones 13), the better the buffering effect on the different thermal conductivities.

It is noted that the FIG. 1 is illustrated from a top-view angle. Practically, the display panel of the embodiment can further comprise an insulating layer (such as an oxide layer) formed between the sealant and the varying pattern zones 13 and 14. In one embodiment, the varying pattern zone 13/14 and the supplemental pattern zone 15/16 can be positioned at the same layer. In the practical application, a photo-mask with patterns for forming traces (including signal lines 11 and the power line 12), the conductive portion at the varying pattern zone 13/14 and the supplemental conductive portion of the supplemental pattern zone 15/16 can be provided for being used in the manufacturing procedure.

Second Embodiment

Figure 4:
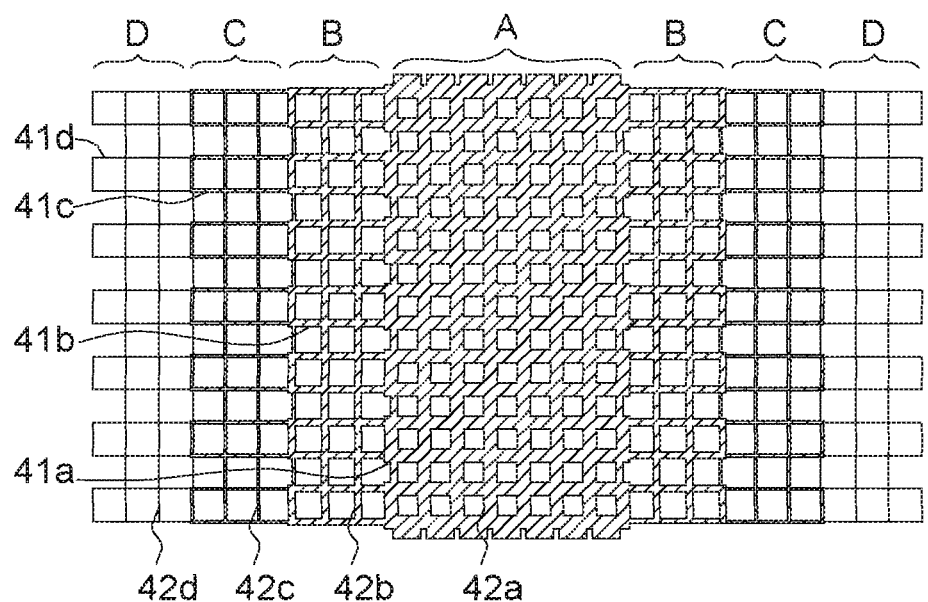
FIG. 4 illustrates a varying pattern zone at the metal region comprising a conductive net according to the second embodiment of the present disclosure.
Figure 5:
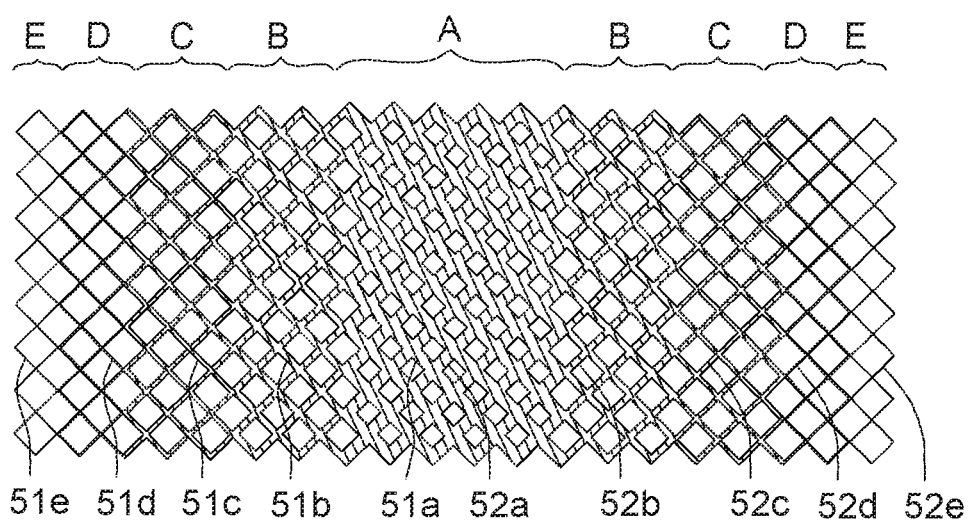
FIG. 5 illustrates a varying pattern zone at the metal region comprising another conductive net according to the second embodiment of the present disclosure.

Please refer to FIG. 1, FIG. 4 and FIG. 5. FIG. 4 illustrates a varying pattern zone at the metal region comprising a conductive net according to the second embodiment of the present disclosure. FIG. 5 illustrates a varying pattern zone at the metal region comprising another conductive net according to the second embodiment of the present disclosure. Position of the varying pattern zone of the second embodiment is corresponding to the sealant dispensing area 30, and the design of the varying pattern zone of the second embodiment can be applied to any metal trace (such as signal line 11 or the power line 12) at the metal region 10, and particularly suitable for the bigger area of the metal region. In the second embodiment, the varying pattern zone comprises a conductive net with a plurality of meshes, and the meshes are, not limitedly, arranged from dense to loose along the direction from the metal region 10 toward the non-metal region 20.

A varying pattern zone 14 applied to a power line 12 of FIG. 1 is exemplified for describing an configuration of the second embodiment. The power line 12 comprises a first portion 121, a varying pattern zone 14 and a second portion 122. The varying pattern zone 14 is positioned between the first portion 121 and the second portion 122, and a conductive net (as shown in FIG. 4, FIG. 5 or other types of the conductive nets) of the varying pattern zone 14 at the metal region connect the first portion 121 and the second portion 122. In one embodiment, the first portion 121 and the second portion 122 are configured as the solid metal blocks having the same width Dp of the trace.

Moreover, it the conductive net of the second embodiment is applied to a trace (such as the varying pattern zone 14 of the power line 12) at the metal region and contiguous to the supplemental pattern zone 15 at the non-metal region 20, the differences in thermal conductivities between the metal region and the non-metal region 20 can be effectively minimized. In practical application, the supplemental pattern zone 15 at the non-metal region 20 can comprises the supplemental conductive portion 151 in a striped pattern as shown in FIG. 3, and can be a net of the second embodiment as a supplemental conductive net at the non-metal region 20. The disclosure has no particular limitation to the design of the supplemental pattern zone 15.

As shown in FIG. 4, a conductive net at the metal region is formed by a plurality of the first conductive wires 41a, 41b, 41c, 41d interwoven with a plurality of the second conductive wires 42a, 42b, 42c, 42d. In one embodiment, the closer the first conductive wires 41a-41d and the second conductive wires 42a-42d to the non-metal region 20, the narrow the widths of those conductive wires. The farther the first conductive wires 41a-41d and the second conductive wires 42a-42d from the non-metal region 20, the wider the widths of those conductive wires. The conductive net of FIG. 4 can be divided into four regions A, B, C and D according to the widths of those conductive wires, and it is noted that the disclosure is not limited to four regions of the conductive net.

As shown in FIG. 4, the first conductive wires 41a, 41b, 41c and 41d are parallel to each other and perpendicular to an extending direction of the trace (such as the power line 12), while the second conductive wires 42a, 42b, 42c and 42d are parallel to each other and also parallel to the extending direction of the trace (such as the power line 12). In the second embodiment, the conductive net has a plurality of meshes in the quadrilateral (ex: square or rectangular) shape due to the first conductive wires 41a-41d interwoven with the second conductive wires 42a-42d.

Similarly, the conductive net of FIG. 5 can be divided into five regions A, B, C, D and E according to the widths of those conductive wires, and the conductive net is formed by a plurality of the first conductive wires 51a, 51b, 51c, 51d and 51e interwoven with a plurality of the second conductive wires 52a, 52b, 52c, 52d and 52e. As shown in FIG. 5, the first conductive wires 51a, 51b, 51c, 51d and 51e are parallel to each other and slanted to an extending direction of the trace (ex: the power line 12), while the second conductive wires 52a, 52b, 52c, 52d and 52e are parallel to each other and slanted to the extending direction of the trace (ex: the power line 12). Also, the conductive net of FIG. 5 has a plurality of meshes in the rhombus shape due to the first conductive wires 51a-51e interwoven with the second conductive wires 52a-52e.

In the second embodiment, an arrangement of the meshes of the conductive net closer to a central line of the trace (i.e. away from the non-metal region 20) is denser than an arrangement of the meshes of the conductive net closer to two sides of the trace, as shown in FIG. 4 and FIG. 5. In other words, the closer the meshes of the conductive net to the center of the trace, the denser the arrangement of the meshes and the larger covering area of the conductive wires of the conductive net. The closer the meshes of the conductive net to two sides of the trace, the looser the arrangement of the meshes and the smaller covering area of the conductive wires of the conductive net.

In the second embodiment, configuration of an embodiment illustrates, but not limitedly, that the closer the first and second conductive wires of the conductive net at the varying pattern region to the non-metal region 20, the narrower the first and second conductive wires in width. The farther the first and second conductive wires from the non-metal region 20, the wider the first and second conductive wires. Take the conductive nets of FIG. 4 and FIG. 5 for example, the configuration in width can be represented as: the width of the conductive wires in region A>the width of the conductive wires in region B>the width of the conductive wires in region C>the width of the conductive wires in region D>the width of the conductive wires in region E.

Moreover, configuration of an embodiment illustrates, but not limitedly, that the closer the meshes of the conductive net to the non-metal region 20, the larger the meshes. The farther the meshes of the conductive net from the non-metal region 20, the smaller the meshes. Take the conductive nets of FIG. 4 and FIG. 5 for example, the configuration of meshes can be represented as: size of the meshes of the conductive wires in region A>size of the meshes of the conductive wires in region B>size of the meshes of the conductive wires in region C>size of the meshes of the conductive wires in region D>size of the meshes of the conductive wires in region E.

It is noted that the number of the conductive wires, the way of interweaving (perpendicular or slanted) between the conductive wires, the shapes of the meshes, the widths of the conductive wires in the regions (ex: regions A-D, and regions A-E), sizes of the meshes of the conductive net, the occupied areas of the conductive wires in their own regions, . . . and etc., are not limited to the ways shown in FIG. 4 and FIG. 5. It is known that configurations of the conductive net can be adjusted and modified according to actual conduction of the practical applications.

Additionally, a supplemental conductive net (having plural supplemental meshes) can be formed at the non-metal region 20 for assorting with the conductive net at the metal region, wherein the supplemental conductive net can comprises a plurality of first conductive wires interwoven with a plurality of second conductive wires. In one application, the widths of the first and second conductive wires in the metal region (i.e. the conductive wires of the conductive net) are larger than the widths of the first and second conductive wires in the non-metal region (i.e. the conductive wires of the supplemental conductive net). In one application, the distances between the adjacent meshes of the conductive net at the metal region are larger than the distances between the adjacent supplemental meshes of the supplemental conductive net at the non-metal region. In one application, the sizes of the meshes of the conductive net at the metal region are smaller than the sizes of the adjacent supplemental meshes of the supplemental conductive net at the non-metal region.

Besides conductive nets formed at the metal region and the non-metal region as described above, the metal region and the non-metal region can comprise the conductive net and the striped conductive portions, respectively. In one application, if a trace (such as a power line 12 in the varying pattern region 14) at the metal region comprises a conductive net of the second embodiment contiguous with the supplemental pattern zone 15 (comprising the striped supplemental conductive portions 151) at the non-metal region 20, a width of the conductive wires of the conductive net adjacent to the supplemental pattern zone 15 is substantially equal to a width $W_{dummy}$ of the supplemental conductive portions 151, thereby harmonizing the conductive patterns and minimizing the differences in thermal conductivities between the metal region and the non-metal region.

According to the aforementioned descriptions, the configurations of conductive patterns at the metal region and the non-metal region on the substrate and corresponding to the sealant dispensing area are provided as illustrated in the embodiments. Please refer to FIG. 1, FIG. 2A to FIG. 2C, FIG. 4 and FIG. 5. Different patterns of the conductive portions at the varying pattern region 13 of the signal line 11 and the varying pattern region 14 of the power line 12 can be adopted. For example, the varying pattern region 13 of the signal line 11 can comprise one type of the striped conductive portions (as shown in FIG. 2A), the zigzag conductive portions (as shown in FIG. 2B) and the slanted conductive portions (as shown in FIG. 2C). The varying pattern region 14 of the power line 12 can comprise another conductive pattern (ex: the conductive portions of the first embodiment, or the conductive net of the second embodiment) which is different from the conductive pattern in the varying pattern region 13 of the signal line 11. Alternatively, the varying pattern region 13 of the signal line 11 and the varying pattern region 14 of the power line 12 can comprise the same or similar conductive patterns (such as both patterns comprising striped conductive portions), but the arrangements of the conductive portions, such as the distribution densities (pitches), and/or width variation, and/or the covering areas of the conductive portions, can be different. For example, the widths of the conductive portions at the varying pattern region 13 of the signal line 11 (having smaller width) are varied in a tendency from wide to narrow towards the non-metal region. Also, the varying pattern region 14 of the metal block with larger width, such as the power line 12 applied with a larger voltage, can be designed by setting wider conductive portions in the area close to the center for occupying more areas, thereby decreasing the resistance. Therefore, the conductive patterns at the different metal regions can be varied and selected according to actual needs of the practical applications, and the disclosure has no particular limitation thereto. Beside the conductive patterns at the metal region, a supplemental pattern zone comprising the supplemental conductive pattern can be further formed at the non-metal region. Also, the conductive patterns at the metal region and the supplemental conductive pattern at the supplemental pattern zone can be arranged and varied by considering the factors (such as the widths, the covering areas, the pitches, . . . and etc.) appropriately to meet the requirement of the application. According to one embodiment, the width of the conductive portions at the metal region is larger than the width of the supplemental conductive portions at the non-metal region. According to one embodiment, the covering area of the conductive portions at the metal region can be larger than the covering area of the supplemental conductive portions at the non-metal region. Also, the distance between adjacent conductive portions at the metal region can be larger than the distance between adjacent supplemental conductive portions at the non-metal region.

Accordingly, the configuration of the varying pattern zones and the supplemental pattern zone of the display panel of the embodiment can minimize the differences in thermal conductivities between the metal region and the non-metal region when the sealant is melted for sealing the first substrate and the second substrate (such as by the laser energy), thereby preventing the defects of the sealant (such as cracking or peeling off) caused by the differences in thermal conductivities and also decreasing the possibility of cracks in the frit. Accordingly, the adhesion of the sealant of the display panel applied by the design of the embodiment can be increased, thereby raising the yield of packaging, improving the electrical performance of the units and prolonging the useful life of the display panel.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic electroluminescence display panel, comprising:
   a substrate having a first surface;
   an organic light-emitting layer, disposed on the first surface;
   a first conductive pattern with a plurality of first meshes disposed on the first surface;
   a second conductive pattern with a plurality of second meshes disposed on the first surface, wherein the second conductive pattern is adjacent to the first conductive pattern, and the second conductive pattern and the first conductive pattern are apart from each other by a space greater than 0 in view of a normal direction of the first surface, wherein the first conductive pattern and the second conductive pattern are separate and non-overlapped in view of the normal direction of the first surface; and
   a sealant dispensing area overlapped with the first conductive pattern and the second conductive pattern,
   wherein a distance between two adjacent meshes of the first meshes is different from a distance between two adjacent meshes of the second meshes.

2. The organic electroluminescence display panel according to claim 1, wherein sizes of the first meshes are smaller than sizes of the second meshes.

3. The organic electroluminescence display panel according to claim 1, wherein at least one of the first conductive pattern and the second conductive pattern is a trace.

4. The organic electroluminescence display panel according to claim 3, wherein each of the first meshes and the second meshes is formed by a plurality of first conductive wires interwoven with a plurality of second conductive wires, and the first and second conductive wires in the first conductive pattern are wider than the first and second conductive wires in the second conductive pattern.

5. The organic electroluminescence display panel according to claim 4, wherein the first conductive wires are parallel to each other and slanted to an extending direction of the trace, while the second conductive wires are parallel to each other and slanted to the extending direction of the trace and the first conductive wires.

6. The organic electroluminescence display panel according to claim 3, wherein the first conductive pattern is the trace and the first meshes are positioned between a first portion and a second portion of the trace, and the first meshes are connected to the first portion and the second portion.

7. The organic electroluminescence display panel according to claim 3, wherein the first conductive pattern is the trace and the second meshes are contiguous to the first meshes, and the sealant dispensing area is overlapped with the first meshes and the second meshes.

8. The organic electroluminescence display panel according to claim 3, wherein an arrangement of the first meshes closer to a central line of the trace is denser than an arrangement of the first meshes closer to two sides of the trace.

9. The organic electroluminescence display panel according to claim 7, wherein the distance between two adjacent meshes of the first meshes is larger than the distance between two adjacent meshes of the second meshes.

10. The organic electroluminescence display panel according to claim 3, wherein the trace is a power line, a data line or a signal line.

11. An organic electroluminescence display panel, comprising:
    a first substrate having a first surface;
    a second substrate assembled to the first substrate;
    an organic light-emitting layer, disposed on the first surface and disposed between the first substrate and the second substrate;
    a first conductive pattern with a plurality of first meshes disposed on the first surface; and
    a second conductive pattern with a plurality of second meshes disposed on the first surface, wherein the second conductive pattern is adjacent to the first conductive pattern, and the second conductive pattern and the first conductive pattern are apart from each other by a space greater than 0 in view of a normal direction of the first surface, wherein the first conductive pattern and the second conductive pattern are separate and non-overlapped in view of the normal direction of the first surface;

a sealant dispensing area overlapped with the first conductive pattern and the second conductive pattern; and a sealant, disposed on the sealant dispensing area and adjacent to edges of the first substrate and the second substrate;

wherein a distance between two adjacent meshes of the first meshes is different from a distance between two adjacent meshes of the second meshes.

12. The organic electroluminescence display panel according to claim 11, wherein the distance between two adjacent meshes of the first meshes is larger than the distance between two adjacent meshes of the second meshes.

13. The organic electroluminescence display panel according to claim 11, wherein sizes of the first meshes are smaller than sizes of the second meshes.

14. The organic electroluminescence display panel according to claim 11, wherein at least one of the first conductive pattern and the second conductive pattern is a trace.

15. The organic electroluminescence display panel according to claim 14, wherein each of the first meshes and the second meshes is formed by a plurality of first conductive wires interwoven with a plurality of second conductive wires, and the first and second conductive wires in the first conductive pattern are wider than the first and second conductive wires in the second conductive pattern.

16. The organic electroluminescence display panel according to claim 15, the first conductive wires are parallel to each other and slanted to an extending direction of the trace, while the second conductive wires are parallel to each other and slanted to the extending direction of the trace and the first conductive wires.

17. The organic electroluminescence display panel according to claim 14, wherein the first conductive pattern is the trace and the first meshes are positioned between a first portion and a second portion of the trace, and the first meshes are connected to the first portion and the second portion.

18. The organic electroluminescence display panel according to claim 14, wherein the first conductive pattern is the trace and the second meshes are contiguous to the first meshes, and the sealant dispensing area is overlapped with the first meshes and the second meshes.

19. The organic electroluminescence display panel according to claim 14, wherein the trace is a power line, a data line or a signal line.

20. The organic electroluminescence display panel according to claim 14, wherein an arrangement of the first meshes closer to a central line of the trace is denser than an arrangement of the first meshes closer to two sides of the trace.

* * * * *